(12) United States Patent
Kline

(10) Patent No.: US 6,483,043 B1
(45) Date of Patent: Nov. 19, 2002

(54) CHIP ASSEMBLY WITH INTEGRATED POWER DISTRIBUTION BETWEEN A WAFER INTERPOSER AND AN INTEGRATED CIRCUIT CHIP

(75) Inventor: Jerry D. Kline, Argyle, TX (US)

(73) Assignee: Eaglestone Partners I, LLC, Long Beach, CA (US)

( * ) Notice: Subject to any disclaimer, the term of this patent is extended or adjusted under 35 U.S.C. 154(b) by 0 days.

(21) Appl. No.: 09/574,361

(22) Filed: May 19, 2000

(51) Int. Cl.⁷ .................................................. H01R 9/09
(52) U.S. Cl. ........................ 174/262; 174/260; 361/601; 361/794
(58) Field of Search ................................ 174/262, 261, 174/260; 361/794, 601; 438/460; 257/734, 698; 324/765

(56) References Cited

U.S. PATENT DOCUMENTS

| | | | |
|---|---|---|---|
| 4,577,214 A | 3/1986 | Schaper | 357/74 |
| 5,060,052 A | 10/1991 | Casto et al. | 357/74 |
| 5,132,613 A * | 7/1992 | Papae et al. | 361/794 |
| 5,309,021 A | 5/1994 | Shimamoto et al. | 257/691 |
| 5,384,691 A | 1/1995 | Neugebauer et al. | 361/794 |
| 5,759,047 A | 6/1998 | Brodsky et al. | 439/66 |
| 5,789,807 A | 8/1998 | Correale, Jr. | 257/691 |
| 5,838,072 A | 11/1998 | Li et al. | 275/786 |
| 5,950,070 A * | 9/1999 | Razon et al. | 438/460 |
| 5,984,691 A | 11/1999 | Brodsky et al. | 439/66 |
| 6,034,332 A * | 3/2000 | Moresco et al. | 361/794 |
| 6,303,992 B1 * | 10/2001 | Van Pham et al. | 257/734 |

* cited by examiner

Primary Examiner—Albert W. Paladini
(74) Attorney, Agent, or Firm—Lawrence R. Youst; Danamraj & Youst, P.C.

(57) ABSTRACT

A chip assembly (162) with integrated power distribution between an integrated circuit chip (164) and a section of wafer interposer (166) is disclosed. The wafer interposer section (166) has first (80, 82) and second (86, 88) sets of contact pads that are electrically and mechanically coupled to first and second sets of contact pads of the integrated circuit chip (164). The wafer interposer section (166) has first (32) and second (36) supply voltage terminals that are respectively coupled to the first (80, 82) and second (86, 88) sets of contact pads of the wafer interposer section (166) that provide first and second supply voltages to the first and second sets of contact pads of the integrated circuit chip (164), thereby integrating power distribution between the integrated circuit chip (164) and the wafer interposer section (166).

32 Claims, 5 Drawing Sheets

- Signal
- Vcc
- Vss

CHIP ASSEMBLY WITH INTEGRATED POWER DISTRIBUTION BETWEEN A WAFER INTERPOSER AND AN INTEGRATED CIRCUIT CHIP

TECHNICAL FIELD OF THE INVENTION

The present invention relates in general to the field of integrated circuits and, more particularly, to the area of integrating power distribution between an integrated circuit chip and an interposer section from a wafer level interposer that are coupled together to form a chip assembly.

BACKGROUND OF THE INVENTION

Modern electronic devices utilize semiconductor integrated circuits, commonly referred to as "chips," which incorporate numerous electronic elements. These chips are typically manufactured in a wafer format, in which numerous similar devices, known as "die" are constructed on a base made from a silicon ingot. Typical silicon wafers have an eight inch diameter (200 mm) with more recent silicon wafers having a twelve inch diameter (300 mm). Once manufactured, these chips are mounted on a substrate which physically support the chips and electrically interconnect the chips with other elements of the circuit. Such substrate may then be secured to an external circuit board or chassis for eventual incorporation into an electronic device.

Demand continues to grow for electronic devices that are smaller, faster, less expensive, more reliable, have a reduced thermal profile and contain more features. These requirements fuel the need for integrating more functionality into smaller form factor die. Several approaches have been attempted to achieve this desired high density integration. One approach is through the use of a system-on-a-chip (SOC). SOC devices typically integrate existing, discrete die into one aggregate die. It has been found, however, that the time it takes to design a SOC is typically longer than the time it takes to integrate a plurality of discrete die together. For example, if a SOC is designed to include a microprocessor, system memory and a controller chip, this design process is more complicated and takes more time as compared to integrating the components in discrete packages, in a flip chip module or in a multichip module. In addition, SOC development is hindered by product roadmap challenges. If compatible circuits are merged into one die, it becomes much more difficult to iterate the individual blocks. For example, if a CPU, a level 2 cache and a North Bridge core were all placed into one integrated die, and if some breakthrough technology was accomplished in the North Bridge core, this new North Bridge core could not simple replace the prior North Bridge core in the SOC, thereby preventing immediate release. Instead, the new design would have to be merged with the other parts forcing the new product release to occur in accordance with the overall product roadmap for the aggregate device. This process slows time to market, requires more management and more integration testing. Thus, these requirements alone may preclude the SOC approach.

In other cases, however, SOC is not even possible. For example, digital components, analog components and memory components can not be integrated into one die. Specifically, digital die are optimized for speed, with less regard for leakage currents and noise while a memory device, can not have high leakage current as it would drop bits and not function properly as a memory device. Likewise, the higher noise levels in digital circuits are not compatible with analog circuits, as analog circuits do not process incoming signals as a "1" or a "0."

Another approach that has been attempted to achieve high density integration is to decrease the width and pitch of the interconnect etch and vias in the semiconductor die. For example, over the past few years, interconnect technology has moved from geometries in the tens of microns to the submicron realm. As such, increases in die density have been achieved. It has been found, however, that small decreases in geometry require the investment of significant capital for equipment, process engineering and design tools. In addition, it has been found that the producibility of die having these reduced interconnect geometries is lower than that of die with larger interconnect geometries. As such, die shrinks are not always feasible or practical.

Therefore, a need has arisen for improved high density integration of integrated circuits. A need has also arisen for such high density integration of integrated circuits that meets the requirement for time to market. A need has further arisen for such improved high density integration of integrated circuits while maintaining acceptable producibility levels.

SUMMARY OF THE INVENTION

The present invention disclosed herein provides for improved high density integration of integrated circuits through the use of a wafer-level interposer that is attached to a wafer prior to singulation such that some of the power distribution routing and interconnects typically integrated into each die are handled by the section of interposer attached to each die after singulation. The present invention achieves high density integration without the increases in time to market typically associated with SOC devices. In addition, the present invention achieves high density integration without the reduction in producibility typically associated with a die shrink. Specifically, by allowing a section of interposer to remain with the chip and handle some of the power distribution, die design can be simplified, a reduction in die density can be achieved, more functionality can be added to a die and die shrinks may be enabled.

The present invention disclosed herein comprises a chip assembly having an integrated circuit chip coupled to a wafer interposer section by electrically and mechanically connecting first and second sets of contact pads of the wafer interposer section with first and second sets of contact pads on the integrated circuit chip. The wafer interposer section has first and second supply voltage terminals that are electrically coupled to the first and second sets of contact pads of the wafer interposer section by first and second power distribution networks which allow for the integration of power distribution between the integrated circuit chip and the wafer interposer section.

More specifically, the wafer interposer section provides numerous points at which voltages, at various levels, may be provided to numerous contact pads on the integrated circuit chip. For example, the first supply voltage terminal, operating at a positive voltage, is electrically coupled to numerous contact pads using the first power distribution network. Likewise, the second supply voltage terminal, operating at ground, is electrically coupled to numerous contact pads using the second power distribution network. Thus, a large number of voltage supply paths may be created between the integrated circuit chip and the wafer interposer section which greatly reduce the complexity of power distribution within the integrated circuit chip. In fact, the integrated circuit chip in the chip assembly of the present invention utilizes numerous strategically positioned power distribution networks to distribute power within the integrated circuit chip in a highly efficient manner.

Generally speaking, each power distribution network of the integrated circuit chip is electrically coupled to one of the contact pads of the integrated circuit chip. Such power distribution networks may comprise a via and a power conductor which is typically disposed in a plane substantially perpendicular to the via. The power conductor may extend in one or more direction from the via depending upon the power distribution requirements. Alternatively, the power distribution network may be electrically coupled to two or more of the contact pads of the integrated circuit chip so long as each of the contact pads is at the same voltage potential. Such voltage potentials include positive voltages, negative voltages and ground.

The present invention also comprises a power distribution system for a chip assembly. The power distribution system includes first and second voltage supply terminals on one surface of a wafer interposer section. The first and second voltage supply terminals are electrically coupled to first and second power distribution networks disposed within the interposer section. A first set of contact pads on the other surface of the wafer interposer section are electrically coupled to the first power distribution network. Likewise, a second set of contact pads on that surface of the wafer interposer section are electrically coupled to the second power distribution network. The power distribution system is completed by electrically coupling a first set of contact pads on an integrated circuit chip to the first set of contact pads of the wafer interposer section and electrically coupling a second set of contact pads on the integrated circuit chip to the second set of contact pads of the wafer interposer section.

The method for distributing power to a chip assembly of the present invention involves, providing a first supply voltage to a first voltage supply terminal on a first surface of a wafer interposer section, providing a second supply voltage to a second voltage supply terminal on the first surface of the wafer interposer section, electrically coupling first and second power distribution networks disposed within the wafer interposer section to the first and second voltage supply terminals, electrically coupling a first set of contact pads on a second surface of the wafer interposer section to the first power distribution network, electrically coupling a second set of contact pads on the second surface of the wafer interposer section to the second power distribution network and electrically coupling first and second sets of contact pads on an integrated circuit chip to the first and second sets of contact pads on the second surface of the wafer interposer section.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not define the scope of the invention.

Figure 1:
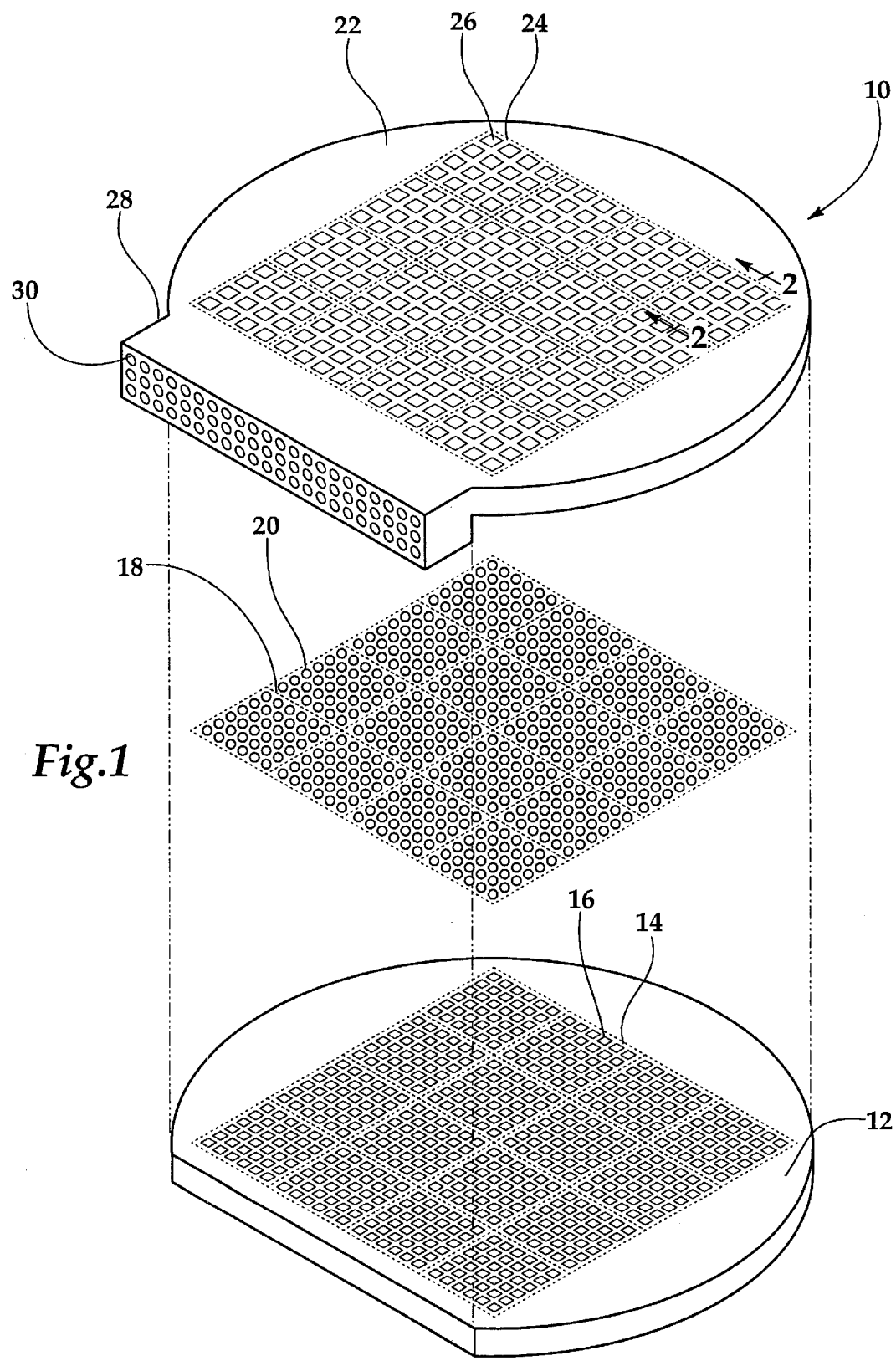
FIG. 1 is an exploded view of a wafer-interposer assembly according to the present invention.

A wafer-interposer assembly used for integrating power distribution to individual integrated circuit chips, which will be diced into chip assemblies of the present invention, is shown in FIG. 1 and generally designated 10. Wafer-interposer assembly 10 comprises a wafer 12 having a plurality of integrated circuit chips 14 thereon. Wafer 12 is depicted as having sixteen chips 14 for simplicity that are separated by dashed lines for clarity. Each chip 14 has a plurality of conductive contact pads 16 on its upper surface. In the illustrated embodiment, thirty-six conductive pads 16 are depicted for each chip 14. It will be understood by those skilled in the art that the actual number of chips 14 on wafer 12 will be dependent upon factors including the size or the wafer and the size of each chip. Also, it will be understood by those skilled in the art that the actual number of pads 16 on chips 14 will be dependent upon factors including the number of required signal and power inputs and outputs (I/O).

For each chip 14 there is a corresponding array 18 of conductive attachment elements 20, one for each contact pad 16. The conductive attachment elements 20 may be solder balls or bumps, screened solder paste, a set of conductive two part or heat cured epoxy, conductive thermoplastic balls or bumps or other electrical and mechanical connection devices known in the art.

The wafer level interposer 22 has an array 24 of conductive contact pads 26 on the surface facing away from the wafer 12. Contact pads 26 typically conform to an industry standard layout. Use of an industry standard layout enables the use of standard surface mount placement equipment and existing infrastructure. The interposer 22 also has an array of conductive contact pads (not shown) on the surface facing the wafer 12. These contact pads are positioned to correspond with pads 16 on the surface of the wafer 12. As will be discussed in more detail below, the contact pads on the opposite surfaces of interposer 22 are not necessarily in a one-to-one relationship with each other. In fact, in the illustrated embodiment, there are more contact pads that correspond to contact pads 16 on wafer 12 than there are contact pads 26.

Figure 2:
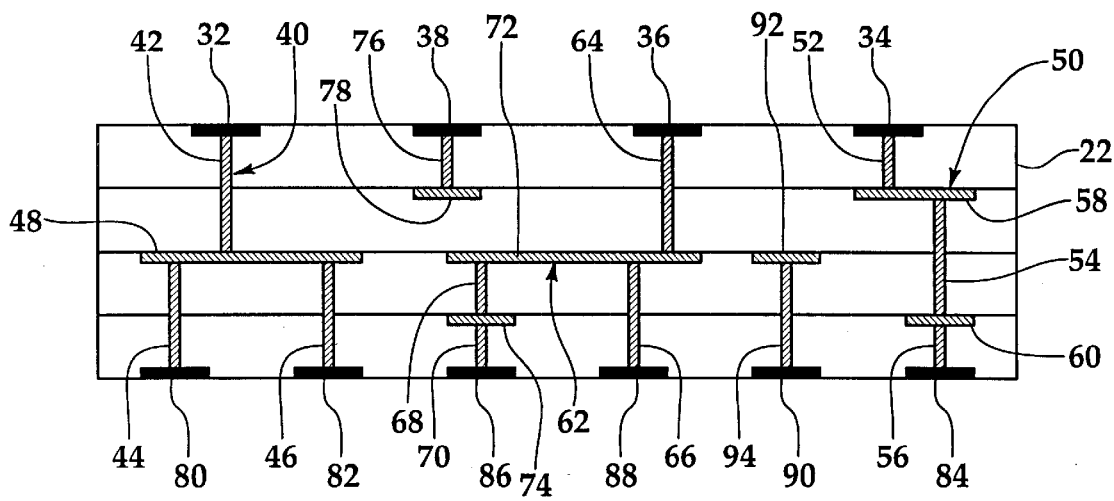
FIG. 2 is a cross-sectional view of an interposer assembly according to the present invention.

FIG. 2 is a cross sectional view of interposer 22 taken along line 2—2 of FIG. 1. Interposer 22 includes a plurality of layers having etched routing lines and vias therein which serve as electrical interconnect lines for power distribution and signal distribution to each chip 14 and to couple each chip 14 to a testing apparatus. As illustrated, interposer 22 includes two supply voltage terminals 32, 34 that carry a power supply voltage (Vcc), one supply voltage terminal 36 that is ground (Vss) and one signal terminal 38. Supply voltage terminal 32 is electrically connected to power distribution network 40 that includes vias 42, 44, 46 and power conductor 48. Supply voltage terminal 34 is electrically connected to power distribution network 50 that includes vias 52, 54, 56 and power conductors 58, 60. Supply voltage terminal 36 is electrically connected to power distribution network 62 that includes vias 64, 66, 68, 70 and power conductors 72, 74. Signal terminal 38 is electrically connected to via 76 and signal conductors 78. Power distribution network 40 carries a Vcc voltage from a power source that is electrically connected to supply voltage terminal 32 to contact pads 80, 82 that are electrically connected to contact pads 16 on a chip 14. Similarly, power distribution network 50 carries a Vcc voltage from a power source that is electrically connected to supply voltage terminal 34 to contact pad 84 that are electrically connected to a contact pad 16 on a chip 14. The two Vcc voltages may be at the same voltage potential or may be at different voltage potentials depending upon the requirements of chips 14. In a like manner, power distribution network 62 carries the Vss voltage from a source, that is electrically connected to supply voltage terminal 36, to contact pads 86, 88 that are electrically connected to contact pads 16 on a chip 14.

As can be seen, the present invention allows for the to integration of power distribution to a chip 14 through interposer 22 by including power distribution networks within interposer 22 that distribute power from a single source to multiple location on a chip 14. Moving some of the power distribution requirements from chips 14 to interposer 22 simplifies power distribution within chips 14. A chip 14 may require millions of transistors to achieve the desired functionality. Each transistor typically needs to be supplied with one or more direct current voltages as well as a ground. This can create a complicated power distribution system within a chip 14 that limits chip performance and negatively impacts the thermal characteristics of chip 14. By designing a chip 14 to take advantage of the power distribution capability of interposer 22, improved performance is achieved. In addition, use of multiple voltage potentials within a chip 14 is enabled through the use of interposer 22. As can be seen, interposer 22 may be used to distribute power at numerous voltage potentials to numerous locations on chips 14 through the use of the various power distribution networks within interposer 22 each of which may be at a different voltage potential.

As stated above, power distribution network 40 electrically connects contact pads 80, 82 to supply voltage terminal 32, power distribution network 50 electrically connects contact pad 84 to supply voltage terminal 34 and power distribution network 62 electrically connects contact pads 86, 88 to supply voltage terminal 36 thus electrically connecting pads 16 on chips 14 to the pads of a substrate to which the chip assembly will be attached, as explained in more detail below. In addition, contact pad 90 electrically connects a contact pad 16 on a chip 14 to a testing conductor 92 through via 94.

Testing conductor 92 passes through interposer 22 connecting pads 16 of chips 14 to testing sockets 30 in testing connector 28, as best seen in FIG. 1. Testing conductor 92 may provide direct electrical connection between testing sockets 30 and pads 16, or may pass through a multiplexer or other intervening apparatus (not shown) incorporated into interposer 22.

Assembly of the wafer 12 and interposer 22 is accomplished through creating a set of permanent electrical and mechanical connections between the wafer 12 and interposer 22 using conductive attachment elements 20. Conductive attachment elements 20 will typically be implemented as features on both the upper and lower surfaces of interposer 22 but may alternatively be placed on wafer 12. Likewise, conductive attachment elements 20 could be incorporated into a sheet or similar structure sandwiched between wafer 12 and interposer 22 during assembly.

Figure 3:
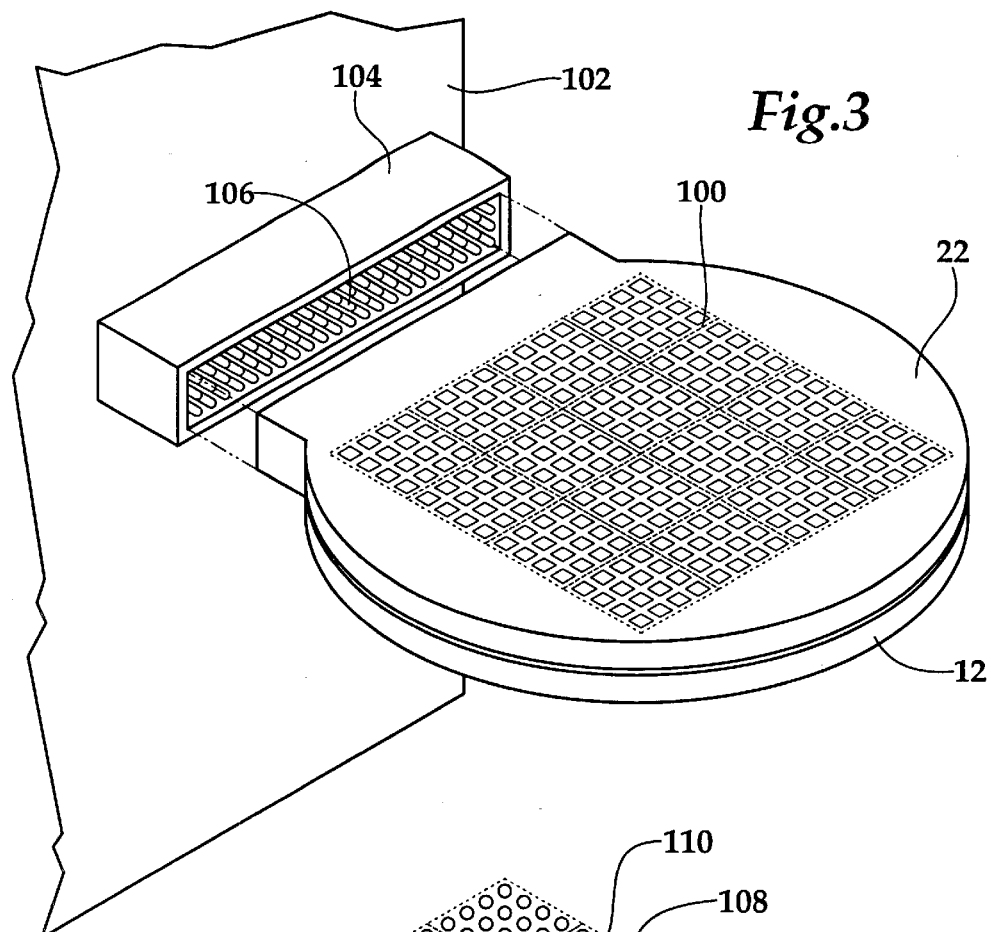
FIG. 3 is a perspective view of a wafer-interposer assembly according to the present invention, being inserted into a testing apparatus.

Turning now to FIG. 3, a wafer 12 and interposer 22 are shown as an assembly 100 ready to be connected to a testing unit 102. The wafer-interposer assembly 100 interfaces with the testing unit 102 through a testing connector 104 comprising a plurality of testing contacts 106, shown here as pins. The testing contacts 106 in the testing connector 104 connect with testing contacts 30 of interposer 22.

After electrical connection to testing unit 102, the wafer-interposer assembly 100 can be run through a complete parametric test, performance test, burn in or whatever subset thereof is deemed necessary for that particular chip design. During the course of testing, each function of chip 14 may ideally be tested across a range of conditions, so as to simulate real world operation. Testing unit 102 may incorporate a heating and cooling apparatus for testing the chips across a range of temperatures. Testing unit 102 may also incorporate a device for vibrating or otherwise mechanically stressing chips 14. During testing, non-conforming chips are identified by testing unit 102 such that they may be discarded after singulation of wafer-interposer assembly 100. Alternatively, where a manufacturer sells a variety of grades of a particular model of chip, individual chips can be graded according to various performance criteria, such as maximum clock speed or thermal stability, for later classification and sorting.

Figure 4:
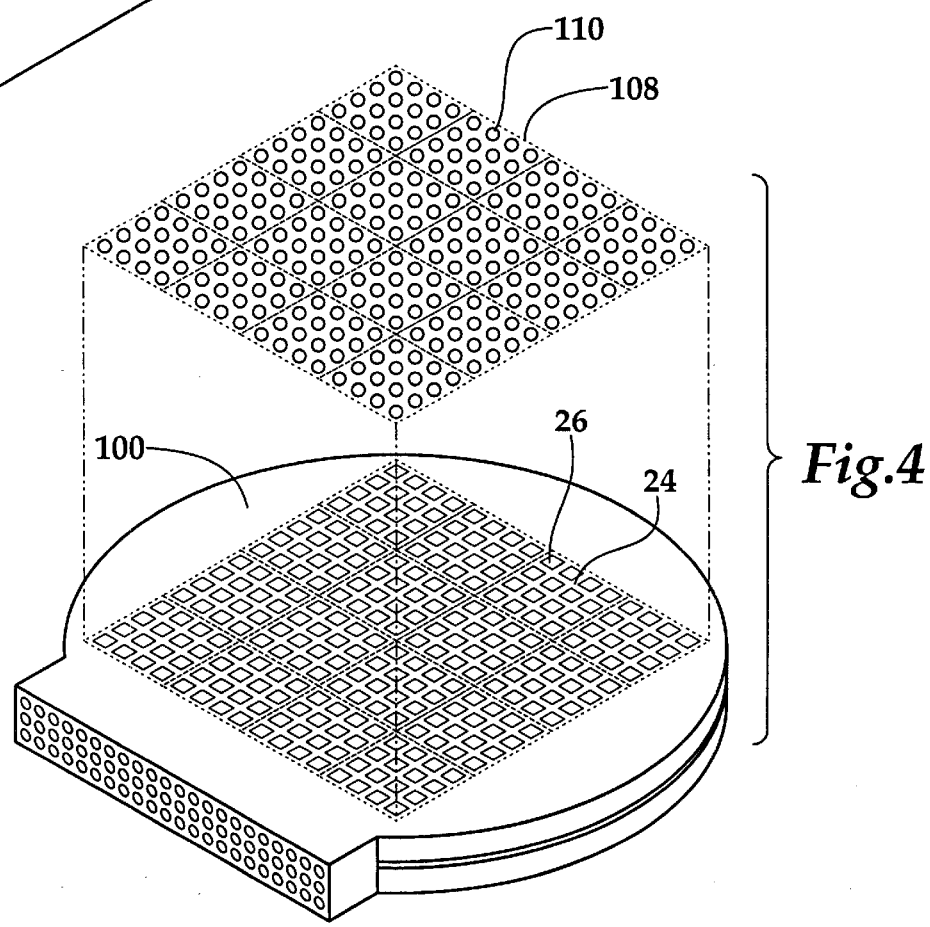
FIG. 4 is an exploded view of a wafer-interposer assembly having an array of conductive attachment elements disposed on the upper surface thereof.

Turning now to FIG. 4, a wafer-interposer assembly 100 is shown having an array 24 of conductive pads 26 on its upper surface. An array 108 of conductive attachment elements 110 may typically be attached to interposer 22 prior to its attachment to wafer 12. Alternatively, the conductive attachment elements 110 may be attached to interposer 22 following testing of chips 14. The conductive attachment elements 110 may be of the types discussed above with reference to FIG. 1.

Figure 7:
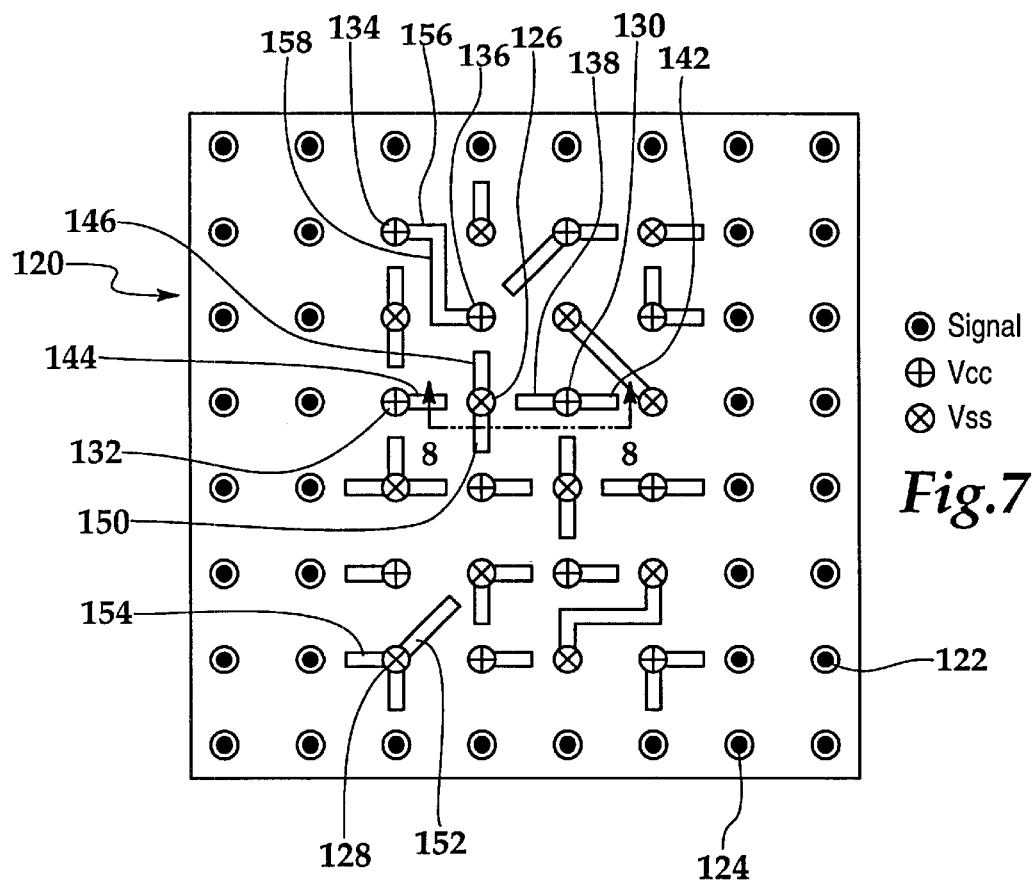
FIG. 7 is a schematic diagram depicting the power distribution methodology for an integrated circuit chip for use in a chip assembly of the present invention.

Referring now to FIG. 7, therein is depicted an integrated circuit chip 120 for use in conjunction with an interposer to form a chip assembly of the present invention. Chip 120 has a connection pattern including a plurality of signal connection sites around the periphery of chip 120 such as contact pads 122 and 124. The connection pattern of chip 120 also includes a plurality of power connection sites for Vss voltage such as contact pads 126 and 128 and for Vcc voltages such as contact pads 130, 132, 134 and 136.

Figure 5:
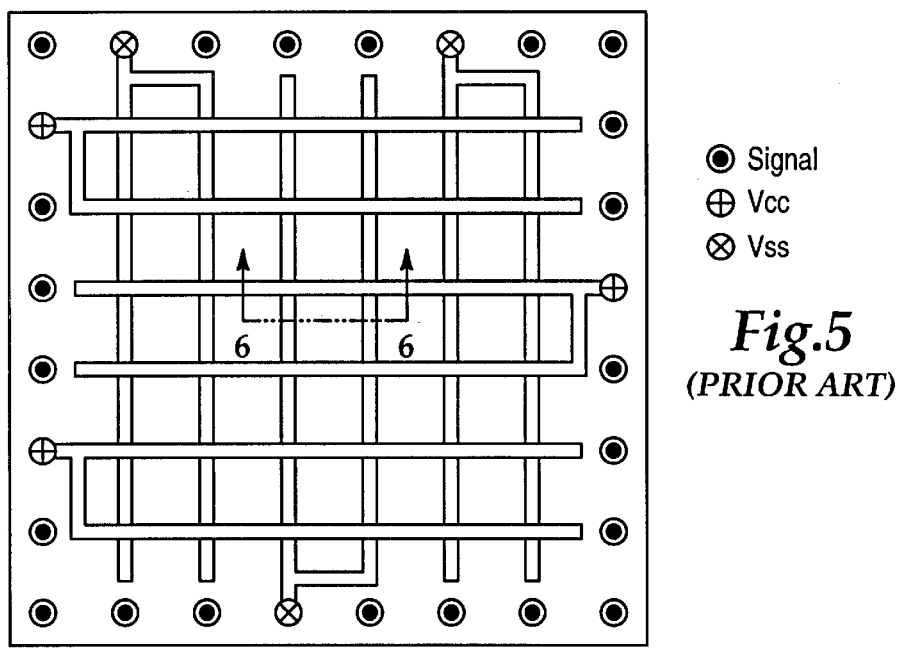
FIG. 5 is a prior art diagram depicting conventional power distribution methodology for an integrated circuit chip.

Unlike prior art chips, such as that depicted in FIG. 5, the connection pattern of chip 120 is not limited to the periphery of the chip. Prior art chips typically employed a wire bonding technique to connect the chip to a substrate. Wire bonding requires that the contact pads lie only at the periphery of the chip as it is difficult or impossible to make wire bonding connections with contacts at the center without resulting in shorts in the wire bonding. As such, both the signal connection sites and the power connection sites are located around the periphery. In this design, power is distributed throughout the chip using a power distribution matrix that occupies a significant portion of the metallization layers of the chip due to the relative width of power conductors as compared to signal conductors. Specifically, power conductors must be wide enough to maintain current capacity at appropriate levels through the chip.

Figure 6:
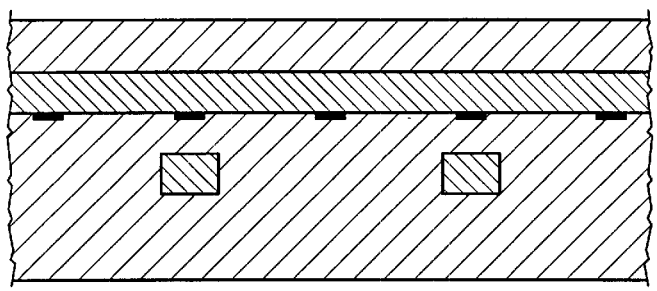
FIG. 6 is a cross sectional view taken along line 6—6 of the integrated circuit chip depicted in the prior art diagram of FIG. 5.

As can be seen in FIG. 6, the prior art Vcc power conductors occupy a significant portion of the metal-3 layer. Likewise, the prior art Vss power conductors occupy a significant portion of the metal-2 layer. It should be noted the power conductors in the metal-1 layer and all signal conductors have been omitted for clarity. Thus, the space occupied by the power distribution matrix limits the number of conductors that carry signals into and out of the chip, thereby limiting the functionality of the chip and limiting the ability to perform die shrinks.

Figure 8:
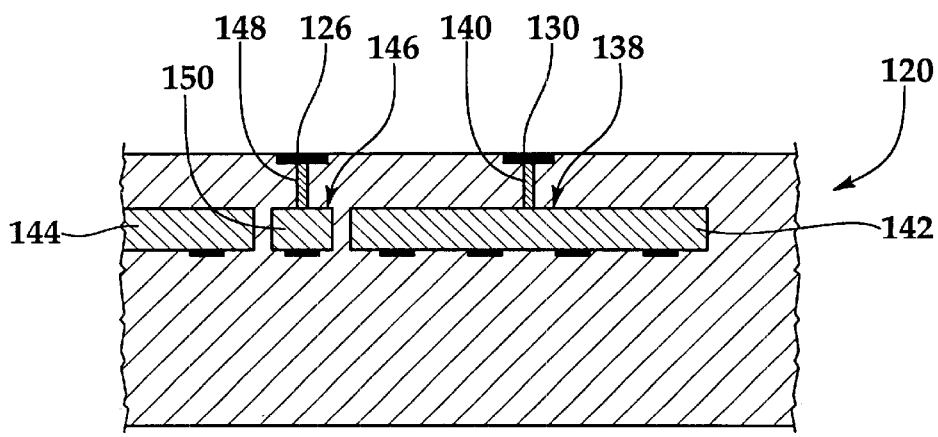
FIG. 8 is a cross sectional view taken along line 8—8 of the integrated circuit chip depicted in FIG. 7.

Chip 120 as used in a chip assembly of the present invention, however, can handle more functionality as power distribution is integrated between chip 120 and an interposer having power distribution networks as descried above with reference to FIG. 2. As illustrated in FIG. 7, chip 120 has more signal connection sites and more power connection than the chip illustrated in FIG. 5. The power connection sites are positioned on chip 120 such that the distance the current must travel within chip 120 is minimized, thereby reducing the likelihood of ground bounce or voltage drops to critical components. As opposed to the power distribution matrix of the prior art, chip 120 utilizes numerous internal power distribution networks. As best seen in FIG. 8, chip 120 includes power distribution network 138 that is electrically connected to contact pad 130 for distribution of a Vcc voltage. Power distribution network 138 includes via 140 and power conductor 142. Power conductor 142 distributes power to a plurality of locations within chip 120. A portion of another power distribution network for distribution of a Vcc voltage is also depicted. This power distribution network is electrically connected to contact pad 132 and includes conductor 144.

Chip 120 also include power distribution network 146 that is electrically connected to contact pad 126 for distribution of a Vss voltage. Power distribution network 146 includes via 148 and power conductor 150. It should be noted by those skilled in the art that above described power distribution networks for distribution of Vcc voltage may be carrying Vcc voltage at different voltage potentials. In addition, those skilled in the art will understand that use of the above described power distribution networks reduces the space within chip 120 needed for power distribution. For example, in the illustrated embodiment all power conductors are in the metal-3 layer leaving the entire metal-2 and metal-1 layers for signal distribution, the signal conductors having been omitted for clarity.

Referring again to FIG. 7, the power distribution networks in chip 120 may have a plurality of configurations such that efficient power distribution within chip 120 can be achieved. For example, the power distribution network associated with contact pad 132 has a power conductor 144 that extends in a single direction relative to contact pad 132. Power conductor 150 of power distribution network 146 extends in two directions relative to contact pad 126. Likewise, power conductor 142 of power distribution network 138 extends in two directions relative to contact pad 130. More complex power distribution networks are also possible. For example, power distribution network 152 has a power conductor 154 that extends in three directions relative to contact pad 128. Additionally, power distribution network 156 has a power conductor 158 that electrically connects contact pad 134 and contact pad 136.

Figure 9:
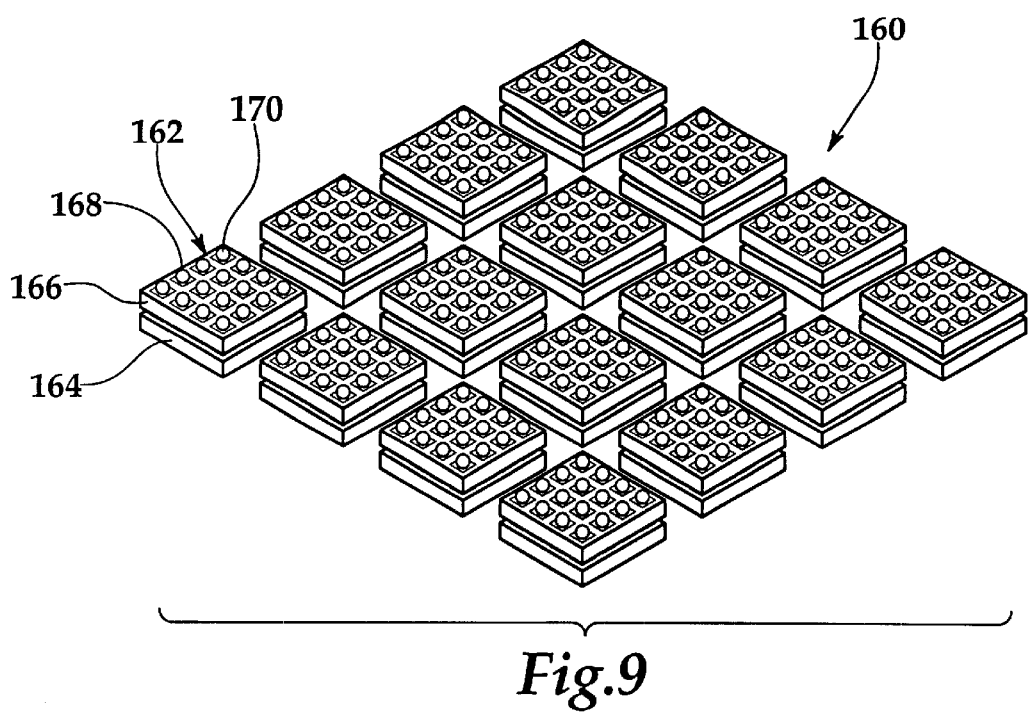
FIG. 9 is an isometric view of a plurality of chip assemblies of the present invention after singulation of the wafer-interposer assembly.

Turning now to FIG. 9, therein is depicted an array of chip assemblies 160 of the present invention, after singulation of the wafer-interposer assembly 100. Each chip assembly 162 comprises a chip 164, a section of interposer 166 and a plurality of conductive attachment elements 170 deposited on conductive pads 168 on the exposed surface of interposer 166. The chip assemblies 162 will be separated into conforming and non-conforming groups or sorted by performance level according to the results of the wafer level testing described in accordance with FIG. 3.

Figure 10:
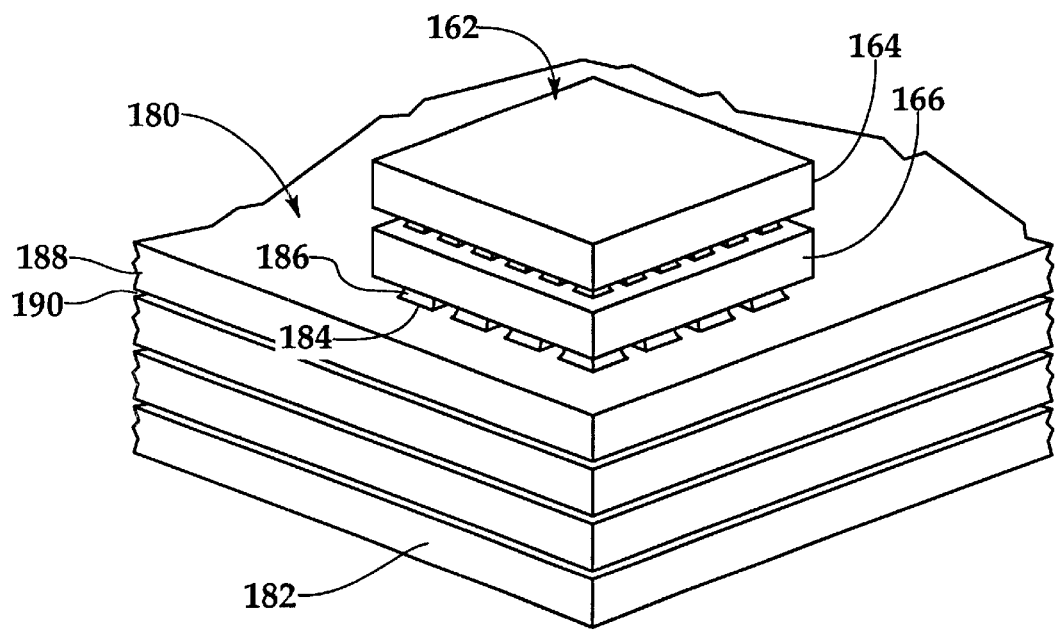
FIG. 10 is an isometric view of a chip assembly of the present invention in place on a substrate.

FIG. 10 shows an assembly 180 comprising a chip assembly 162 mounted on a substrate 182 having a plurality of dielectric layers 188 and conductive layers 190. Chip assembly 162 is electrically and mechanically attached to pads 184 on the surface of the substrate 182 through conductive attachment elements 186. Chip assembly 162 communicates with s other electronic devices (not shown) through the conductive layers 190 of the substrate 182. Assembled as shown, the interposer 166 provide electrical connection between chip 164 and substrate 182. Thus, the power supplied from substrate 182 to chip 164 passes through the various power distribution networks within interposer 166 such that power distribution is integrated between interposer 166 and chip 164. The large number of voltage supply paths created between substrate 182 and chip 164 by interposer 166 greatly reduces the complexity of the power distribution required within chip 164. Chip 164 utilizes numerous strategically positioned power distribution networks within chip 164 to distribute power to the various transistors within chip 164 in a highly efficient manner.

It should be apparent to those skilled in the art that the chip assemblies of the present invention have inherent advantage over the prior art. Specifically, by integrating the power distribution between a chip and an interposer, chip design can be simplified by avoiding the need for complicated and circuitous routing of power and signal interconnect lines. In addition, a reduction in die density can be achieved which could enable the use of wider signal conductors in a chip while maintain the same level of functionality and increasing the producibility of the chip. Alternatively, more functionality may be added to a chip without increasing chip size or decreasing line width. Likewise, a die shrink may be enabled without a reduction in functionality but with a potential improvement in performance and increase in the number of chips that are accommodated by a wafer.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description it is therefore intended that the appended claims encompass any such modifications or embodiments.

What is claimed is:

1. A chip assembly comprising:
  an integrated circuit chip having first and second sets of contact pads; and
  a wafer interposer section having first and second sets of contact pads that are electrically and mechanically coupled to the first and second sets of contact pads of the integrated circuit chip, respectively, the wafer interposer section having first and second supply voltage terminals, the first supply voltage terminal being electrically coupled to the first set of contact pads of the wafer interposer section, the second supply voltage terminal being electrically coupled to the second set of contact pads of the wafer interposer section, thereby integrating power distribution between the integrated circuit chip and the wafer interposer section.

2. The chip assembly as recited in claim 1 wherein the wafer interposer section further comprises first and second power distribution networks, the first power distribution network electrically coupling the first supply voltage terminal to the first set of contact pads of the wafer interposer section, the second power distribution network electrically coupling the second supply voltage terminal to the second set of contact pads of the wafer interposer section.

3. The chip assembly as recited in claim 1 wherein the integrated circuit chip further comprises a power distribution network electrically coupled to one of the contact pad of the first set of contact pads of the integrated circuit chip.

4. The chip assembly as recited in claim 3 wherein the a power distribution network further comprises a via and a power conductor.

5. The chip assembly as recited in claim 4 wherein the a power conductor is disposed in a plane substantially perpendicular to the via.

6. The chip assembly as recited in claim 4 wherein the a power conductor extends in a first direction from the via.

7. The chip assembly as recited in claim 4 wherein the a power conductor extends in first and second directions from the via.

8. The chip assembly as recited in claim 4 wherein the a power conductor extends in first, second and third directions from the via.

9. The chip assembly as recited in claim 1 wherein the integrated circuit chip further comprises a power distribution network electrically coupled to two of the contact pads of the first se t of contact pads of the integrated circuit chip.

10. The chip assembly as recited in claim 1 wherein the first supply voltage is a positive voltage and the second supply voltage is ground.

11. The chip assembly as recited in claim 1 further comprising a plurality of conductive attachment elements disposed between the first and second sets of contact pads of the integrated circuit chip and first and second sets of contact pads of the wafer interposer section.

12. A chip assembly comprising:
an integrated circuit chip having a plurality of contact pads; and
a wafer interposer section having first and second surfaces, the first surface having a plurality of contact pads oriented for complementary attachment to the contact pads of the integrated circuit chip, the second surface having a plurality of contact pads having an orientation different from that of the contact pads on the first surface,
wherein at least one contact pad of the plurality of contact pads on the second surface is electrically coupled to a set of contact pads of the plurality of contact pads of the first surface.

13. The chip assembly as recited in claim 12 wherein the number of contact pads on the first surface of the wafer interposer section is greater than the number of contact pads on the second surface of the wafer interposer section.

14. The chip assembly as recited in claim 12 wherein the number of contact pads on the first surface of the wafer interposer section for power distribution is greater than the number of contact pads on the second surface of the wafer interposer section for power distribution.

15. A chip assembly comprising:
an integrated circuit chip having first and second sets of contact pads; and
a wafer interposer section having first and second sets of contact pads that are electrically and mechanically coupled to the first and second sets of contact pads of the integrated circuit chip, respectively, the wafer interposer section having first and second supply voltage terminals and first and second power distribution networks, the first supply voltage terminal being electrically coupled to the first set of contact pads of the wafer interposer section by the first power distribution network, the second supply voltage terminal being electrically coupled to the second set of contact pads of the wafer interposer section by the second power distribution network, thereby integrating power distribution between the integrated circuit chip and the wafer interposer section.

16. The chip assembly as recited in claim 15 wherein the integrated circuit chip further comprises a power distribution network electrically coupled to one of the contact pad of the first set of contact pads of the integrated circuit chip.

17. The chip assembly as recited in claim 16 wherein the a power distribution network further comprises a via and a power conductor, the power conductor being disposed in a plane substantially perpendicular to the via.

18. The chip assembly as recited in claim 16 wherein the a power conductor extends in a first direction from the via.

19. The chip assembly as recited in claim 16 wherein the a power conductor extends in first and second directions from the via.

20. The chip assembly as recited in claim 16 wherein the a power conductor extends in first, second and third directions from the via.

21. The chip assembly as recited in claim 15 wherein the integrated circuit chip further comprises a power distribution network electrically coupled to two of the contact pads of the first set of contact pads of the integrated circuit chip.

22. The chip assembly as recited in claim 15 wherein the first supply voltage is a positive voltage and the second supply voltage is ground.

23. The chip assembly as recited in claim 15 further comprising a plurality of conductive attachment elements disposed between the first and second sets of contact pads of the integrated circuit chip and first and second sets of contact pads of the wafer interposer section.

24. A power distribution system for a chip assembly comprising:
first and second voltage supply terminals on a first surface of a wafer interposer section;
first and second power distribution networks disposed within the interposer section and electrically coupled to the first and second voltage supply terminals, respectively;
a first set of contact pads on a second surface of the wafer interposer section electrically coupled to the first power distribution network;
a second set of contact pads on a second surface of the wafer interposer section electrically coupled to the second power distribution network;
a first set of contact pads on an integrated circuit chip electrically coupled to the first set of contact pads on a second surface of the wafer interposer section; and a second set of contact pads on the integrated circuit chip electrically coupled to the second set of contact pads on the second surface of the wafer interposer section.

25. The power distribution system as recited in claim 24 wherein the integrated circuit chip further comprises a power distribution network electrically coupled to one of the contact pad of the first set of contact pads of the integrated circuit chip.

26. The power distribution system as recited in claim 25 wherein the a power distribution network further comprises a via and a power conductor, the power conductor being disposed in a plane substantially perpendicular to the via.

27. The power distribution system as recited in claim 25 wherein the e first supply voltage is a positive voltage and the s second supply voltage is ground.

28. The power distribution system as recited in claim 25 further comprising a plurality of conductive attachment elements disposed between the first and second sets of contact pads of the integrated circuit chip and first and second sets of contact pads of the wafer interposer section.

29. A method for distributing power to a chip assembly comprising the steps of:
providing a first supply voltage to a first voltage supply terminal on a first surface of a wafer interposer section;
providing a second supply voltage to a second voltage supply terminal on the first surface of the wafer interposer section;
electrically coupling first and second power distribution networks disposed within the interposer section to the first and second voltage supply terminals, respectively;
electrically coupling a first set of contact pads on a second surface of the wafer interposer section to the first power distribution network;
electrically coupling a second set of contact pads on the second surface of the wafer interposer section to the second power distribution network; and
electrically coupling first and second sets of contact pads on an integrated circuit chip to the first and second sets of contact pads on the second surface of the wafer interposer section, respectively.

30. The method as recited in claim 29 further comprising the step of electrically coupling a power distribution network in the integrated circuit chip to one of the contact pads of the first set of contact pads of the integrated circuit chip.

31. The method as recited in claim 29 wherein the step of providing a first supply voltage further comprises supplying a positive voltage and wherein the step of providing a second supply voltage further comprises supplying a ground.

32. The method as recited in claim 29 wherein the step of electrically coupling the first and second sets of contact pads on an integrated circuit chip to the first and second sets of contact pads on the second surface of the wafer interposer section further comprises mechanically and electrically coupling the first and second sets of contact pads on an integrated circuit chip to the first and second sets of contact pads on the second surface of the wafer interposer section with conductive attachment elements.

* * * * *